US010090632B2

(12) United States Patent
Liang

(10) Patent No.: US 10,090,632 B2
(45) Date of Patent: Oct. 2, 2018

(54) LASING OUTPUT BASED ON VARYING MODAL INDEX

(71) Applicant: Hewlett Packard Enterprise Development LP, Houston, TX (US)

(72) Inventor: Di Liang, Santa Barbara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/110,429

(22) PCT Filed: Feb. 28, 2014

(86) PCT No.: PCT/US2014/019393
§ 371 (c)(1),
(2) Date: Jul. 8, 2016

(87) PCT Pub. No.: WO2015/130306
PCT Pub. Date: Sep. 3, 2015

(65) Prior Publication Data
US 2016/0336708 A1  Nov. 17, 2016

(51) Int. Cl.
*H01S 3/083* (2006.01)
*H01S 5/10* (2006.01)
(Continued)

(52) U.S. Cl.
CPC .......... *H01S 3/083* (2013.01); *G02B 6/29341* (2013.01); *H01S 3/0637* (2013.01);
(Continued)

(58) Field of Classification Search
CPC ...... H01S 5/1071; H01S 5/142; H01S 5/1032; H01S 5/1021; H01S 5/1028;
(Continued)

(56) References Cited

U.S. PATENT DOCUMENTS 5,544,268 A * 8/1996 Bischel .................. G02F 1/011
385/16
6,819,691 B2  11/2004 Fan
(Continued)

FOREIGN PATENT DOCUMENTS

CN  101036076 A  9/2007
CN  101593931 B  12/2009
(Continued)

OTHER PUBLICATIONS

Manipatruni, S., et al., Ultra-Low Voltage, Ultra-Small Mode Volume Silicon Microring Modulator, Optics Express, Aug. 16, 2010, pp. 18235-18242.
(Continued)

*Primary Examiner* — Kinam Park
(74) *Attorney, Agent, or Firm* — Hewlett Packard Enterprise Patent Department

(57) ABSTRACT

An example device in accordance with an aspect of the present disclosure includes a ring waveguide and bus waveguide. The ring waveguide has a first coupled portion associated with a first modal index, and the bus waveguide includes a second coupled portion associated with a second modal index. The second coupled portion is evanescently coupleable to the first coupled portion. A laser outcoupling and associated lasing output of the device is variable based on varying a difference between the first modal index and the second modal index to vary coupling between the first coupled portion and the second coupled portion, without varying modal indices of non-coupled portions of the ring waveguide and bus waveguide.

17 Claims, 7 Drawing Sheets

(51) Int. Cl.
*H01S 5/12* (2006.01)
*G02B 6/293* (2006.01)
*H01S 5/14* (2006.01)
*H01S 3/063* (2006.01)
*H01S 3/102* (2006.01)

(52) U.S. Cl.
CPC ............ *H01S 3/102* (2013.01); *H01S 3/1028* (2013.01); *H01S 5/1021* (2013.01); *H01S 5/1028* (2013.01); *H01S 5/1071* (2013.01); *H01S 5/1225* (2013.01); *H01S 5/142* (2013.01); *H01S 5/1032* (2013.01)

(58) Field of Classification Search
CPC ........ H01S 5/1225; H01S 3/083; H01S 3/102; H01S 3/1028; H01S 3/0637
See application file for complete search history.

(56) References Cited

U.S. PATENT DOCUMENTS

| | | | |
|---|---|---|---|
| 6,947,632 B2 | 9/2005 | Fischer | |
| 6,947,642 B2 | 9/2005 | Yamazaki | |
| 7,738,527 B2 | 6/2010 | He | |
| 8,610,994 B1 | 12/2013 | Lentine et al. | |
| 2002/0081055 A1* | 6/2002 | Painter | B23K 26/0823 385/2 |
| 2002/0090160 A1* | 7/2002 | Lim | B82Y 20/00 385/11 |
| 2002/0105998 A1* | 8/2002 | Ksendzov | H01S 5/1032 372/92 |
| 2003/0072534 A1* | 4/2003 | Bona | G02B 6/12007 385/40 |
| 2004/0008942 A1 | 1/2004 | Scheuer et al. | |
| 2004/0227089 A1 | 11/2004 | Kolodzey et al. | |
| 2005/0207464 A1* | 9/2005 | Blauvelt | H01S 5/026 372/64 |
| 2006/0039653 A1* | 2/2006 | Painter | B82Y 20/00 385/50 |
| 2006/0072875 A1 | 4/2006 | Bhagavatula et al. | |
| 2006/0198415 A1 | 9/2006 | Yamazaki | |
| 2006/0198416 A1* | 9/2006 | Yamazaki | H01S 5/142 372/94 |
| 2008/0267239 A1* | 10/2008 | Hall | B82Y 20/00 372/46.013 |
| 2009/0028504 A1 | 1/2009 | Wu et al. | |
| 2009/0078963 A1 | 3/2009 | Khodja | |
| 2009/0226129 A1 | 9/2009 | Kuipers et al. | |
| 2010/0266232 A1 | 10/2010 | Lipson et al. | |
| 2010/0314027 A1 | 12/2010 | Blauvelt et al. | |
| 2011/0026879 A1 | 2/2011 | Popovic et al. | |
| 2012/0134628 A1 | 5/2012 | Hoekman et al. | |
| 2013/0243383 A1 | 9/2013 | Agarwal et al. | |
| 2013/0322472 A1 | 12/2013 | Li | |
| 2016/0204578 A1* | 7/2016 | Li | H01S 5/142 372/20 |

FOREIGN PATENT DOCUMENTS

| | | |
|---|---|---|
| CN | 101800307 B | 8/2010 |
| CN | 103259190 A | 8/2013 |

OTHER PUBLICATIONS

PCT/ISA/KR, International Search Report, dated Feb. 28, 2014, PCT/US2014/019393, 12 pps.
Bogaerts, W. et al., "Silicon Microring Resonators," Laser & Photonics Reviews 6.1, 2012, pp. 47-73, available at http://pcphotonics.intec.ugent.be/download/pub_3105.pdf.
Chin, M. K. et al., "Design and Modeling of Waveguide-Coupled Single-Mode Microring Resonators," Journal of Lightwave Technology 16.8, Aug. 1998, pp. 1433-1446.
Dai, D. et al., "Enhancement of the Evanescent Coupling Between III-V/Si Hybrid Microring Laser and Bus Waveguide by Using a Bending Coupler," 2009, 8 pages.
Extended European Search Report for EP Application No. 13895679.2; dated Jul. 26, 2017; pp. 7.
Fan, G. et al., "Improved Coupling Technique of Ultracompact Ring Resonators in Silicon-on-insulator Technology," (Research Paper), Applied Optics 51.21, Jul. 12, 2012, pp. 5212-5215.
Gardes, F. Y. et al, "Evolution of Optical Modulation Using Majority Carrier Plasma Dispersion Effect in SOI," Silicon Photonics III, Proc. of SPIE, vol. 6898, 2008, 10 pages.
International Search Report & Written Opinion received in PCT Application No. PCT/US2013/065116, dated Jul. 4, 2014, 14 pages.
Sacher, W. D. et al., "Characteristics of Microring Resonators With Waveguide-Resonator Coupling Modulation," Lightwave Technology, Journal of 27.17, 2009, pp. 3800-3811.
Sacher, W, D. et al., "Dynamics of Microring Resonator Modulators," Optics Express 16.20, 2008, pp. 15741-15753.
Wang, C. Y. et al., "Design and Analysis of Ultra Small Radius Micro-Ring Resonator," 2013, 7 pages.
Yariv, A., "Critical Coupling and Its Control in Optical Waveguide-Ring Resonator Systems," IEEE Photonics Technology Letters 14.4, Apr. 2002, pp. 483-485.
Liang, D., et al.; Non-Final Office Action issued in U.S. Appl. No. 15/027,096; dated Apr. 19, 2018; 8 pages.

* cited by examiner

LASING OUTPUT BASED ON VARYING MODAL INDEX

BACKGROUND

Photonic circuits may use optical resonators, such as ring resonators. The circuit may vary a resonance wavelength of the ring resonator by acting on the entire ring resonator. Varying the ring resonator is associated with relatively high energy consumption and other fundamental properties associated with optical resonators, such as wavelength shift.

BRIEF DESCRIPTION OF THE DRAWINGS/FIGURES

DETAILED DESCRIPTION

Figure 1:
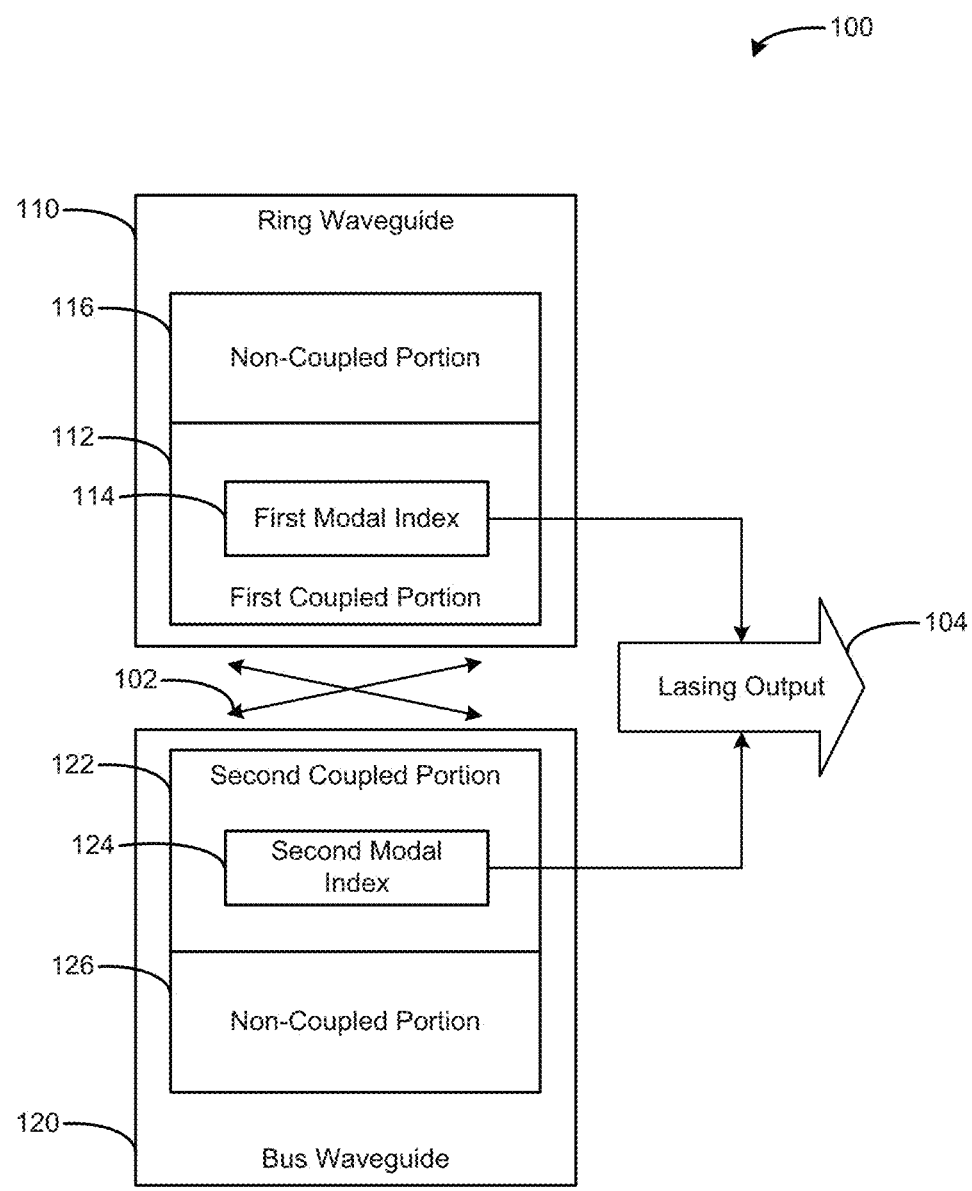
FIG. 1 is a block diagram of a device including a ring waveguide and bus waveguide according to an example.

Integrated optical photonic interconnect systems may use ring resonator lasers as a light source. Such lasers provide various benefits, including having a compact structure/footprint, desirable resonance effects, and natural compatibility with wavelength division multiplexing (WDM). A diode laser, including a ring resonator laser, may be modulated by varying an injection current. However, in general, varying the injection current to modulate the laser causes undesirable wavelength shift (e.g., "chirp"), and high power consumption. In contrast to varying the injection current, examples described herein may provide a lasing output based on a direct modulated laser structure. Such outcoupling modulated laser structures provide high efficiency regarding power consumption and modulation depth, and may vary an output coupling of the laser directly, (e.g., mirror loss), without a need to vary the injection/bias current. The example structures and techniques may be applied generally to many different types of laser structures, such as solid state lasers.

Thus, instead of varying an injection current or changing a device geometry, examples described herein may selectively vary an evanescent coupling between a ring waveguide and input and/or output waveguides, without varying non-coupled portions of the waveguides. The coupling may be varied by selectively modulating a modal index of a coupling section of the output waveguide and/or lasing resonator, to provide a relatively large change to a coupling coefficient, as well as a phase change. Accordingly, unlike conventional laser injection current modulation or other coupling modulation approaches, the example structures/techniques described herein achieve relatively lower power consumption and higher-speed modulation, while preserving a compact design footprint.

Example devices/systems/techniques may maintain a relatively low and constant bias point, without a need to change carrier concentration or applied current/electrical power. Thus, a temperature of the resonator cavity (e.g., ring waveguide, bus waveguide, output waveguide, and so on) may be maintained at a relatively stable range. Accordingly, the effects of changes in carrier concentration, power, and temperature may be minimized and/or prevented from changing waveguide indices. As a result, undesirable wavelength shift is very small or zero, and the laser may be maintained at a desirable and relatively low bias point, all while allowing example devices/systems to vary the lasing output. For example, a reliable optical signal may be output, which supports a binary 1 and 0 for reliable digital communications. The lasing output is differentiatable while maintaining the laser in a relatively low power consumption regime. Accordingly, examples described herein can use selective coupling modulation to achieve comparably faster modulation speeds and greater power efficiency with little or zero chirp, in stark contrast to resonator modulation based on current injection or other techniques (e.g., non-selective modulation).

FIG. 1 is a block diagram of a device 100 including a ring waveguide 110 and bus waveguide 120 according to an example. The ring waveguide 110 is coupled to the bus waveguide 120 based on evanescent coupling 102 to produce lasing output 104. The ring waveguide 110 includes a first coupled portion 112 and non-coupled portion 116. The first coupled portion 112 is associated with a first modal index 114. The bus waveguide 120 includes a second coupled portion 122 and non-coupled portion 126. The second coupled portion 122 is associated with a second modal index 124. The first modal index 114 and the second modal index 124 may be varied by changing an actual material index of the waveguide core and/or the waveguide cladding, to vary the evanescent coupling 102 between the first coupled portion 112 and the second coupled portion 122, without varying modal indices of non-coupled portions 116, 126 of the ring waveguide 110 and bus waveguide 120, to vary the lasing output 104.

Lasing output 104 may be varied based on lasing outcoupling of the ring waveguide 110 and/or bus waveguide 120, to extract energy from the device 100 in the form of lasing output 104. The lasing outcoupling may be varied based on a variable difference between the first modal index 114 and the second modal index 124. Optical power in device 100 bounces back and forth between the ring waveguide 110 and bus waveguide 120, based on evanescent coupling 102. In an example (e.g., where the ring waveguide 110 is a laser resonator for illustrative purposes, instead of the bus waveguide 120), optical power that is coupled from the ring waveguide 110 to the bus waveguide 120 (and/or optical power that remains in the ring waveguide 110) follows a sine wave relationship according to the difference between the first modal index 114 and the second modal index 124. When the material index of bus waveguide 120 is slightly reduced (e.g., based on the difference of: material index of ring waveguide−material index of bus waveguide=0.1), the second modal index 124 better matches with the first modal index 114. Thus, the laser outcoupling changes to a much greater degree compared to the change in material indices. The degree to which modal index changes affect laser outcoupling also may be affected by coupler length (Lc), or the amount of the waveguides that are physically laid out to be exposed to each other to achieve evanescent coupling 102. Optical power in the ring can be coupled out either very little (e.g., where the first and second modal indices 114, 124 are quite different from each other), or very much (e.g., where the first and second modal indices 114, 124 are quite similar). Based on this effect, output optical power (lasing output 104) can be modulated, by changing the second modal index 124 of the bus waveguide 120 (or by changing the first modal index 114 of the ring waveguide 110).

The term "modal index" generally describes and/or depends upon how well light is being confined in a waveguide. Thus, the first modal index 114 and the second modal index 124 may be affected based on a material index of the particular waveguide material itself (e.g., silicon semiconductor material or other suitable materials for waveguides), as well as a cladding material o the waveguide. In examples described herein, a waveguide may be selectively tuned, to change a modal index in one portion of a waveguide, without changing a modal index in another portion of the waveguide (e.g., by selectively applying heat or injecting carriers into a portion of that waveguide). The selective changing of the first modal index 114 and/or the second modal index 124, without changing the modal indices of the non-coupled portions 116, 126, enables control over the variable lasing output 104, e.g., to provide binary 1 and 0 output for digital optical communication.

Figure 2:
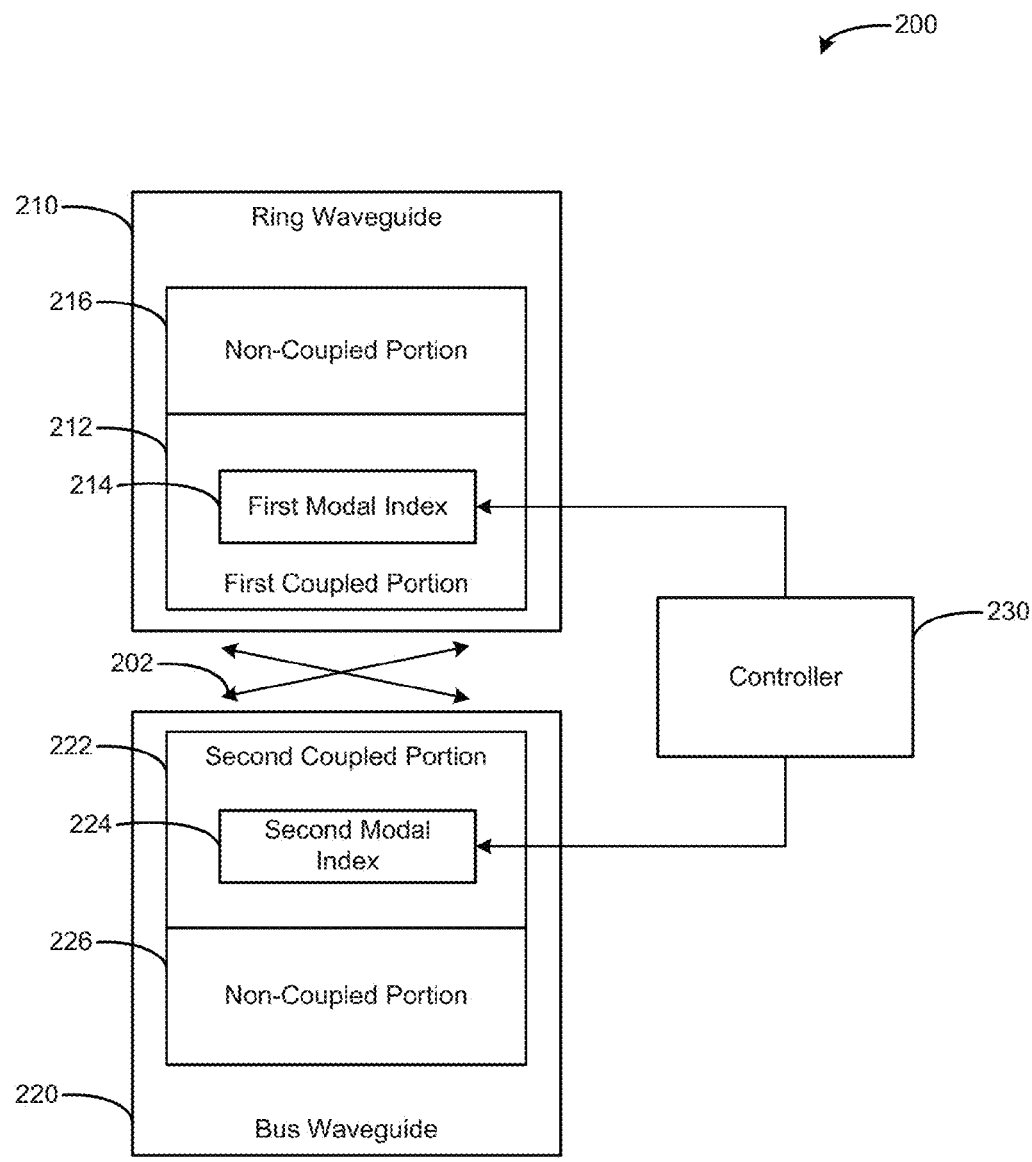
FIG. 2 is a block diagram of a system including a ring waveguide bus waveguide, and controller according to an example.

FIG. 2 is a block diagram of a system 200 including a ring waveguide 210, bus waveguide 220, and controller 230 according to an example. The ring waveguide 210 is coupled to the bus waveguide 220 based on evanescent coupling 202. The ring waveguide 210 includes a first coupled portion 212 and non-coupled portion 216. The first coupled portion 212 is associated with a first modal index 214. The bus waveguide 220 includes a second coupled portion 222 and non-coupled portion 226. The second coupled portion 222 is associated with a second modal index 224. A controller 230 is to vary a difference between the first modal index 214 and the second modal index 224, to vary the evanescent coupling 202 between the first coupled portion 212 and the second coupled portion 222, without varying modal indices of non-coupled portions 216, 226 of the ring waveguide 210 and bus waveguide 220.

The controller 230 may be a modulation actuator to vary modal indices. The controller 230 may be coupled to various modulating components at the waveguides, to affect the waveguides based on heat tuning, electrical tuning, mechanical tuning, acoustic tuning, magnetic tuning, and/or other tuning techniques. For example, the ring waveguide 210 may include a heater modulating component to affect the first coupled portion 214 of the ring waveguide 210. For example, the controller 230 may be coupled to adjust a heat output of the heater, thereby selectively adjusting the first modal index 214 of the first coupled portion 212 of the ring waveguide 210, without adjusting the non-coupled portion 216. Similarly, the controller 230 may be coupled to other modulating components at the ring waveguide 210 and/or bus waveguide 220, to cause changes in the modal indices 214, 224. As a result of the adjusting by controller 230, a lasing output of the device 200 may be controlled. In an example, the ring waveguide 210 and bus waveguide 220 may be provided on a substrate, and the controller 230 may be provided on a circuit board or other control system that is electrically coupled to the modulating components at the substrate.

Figure 3:
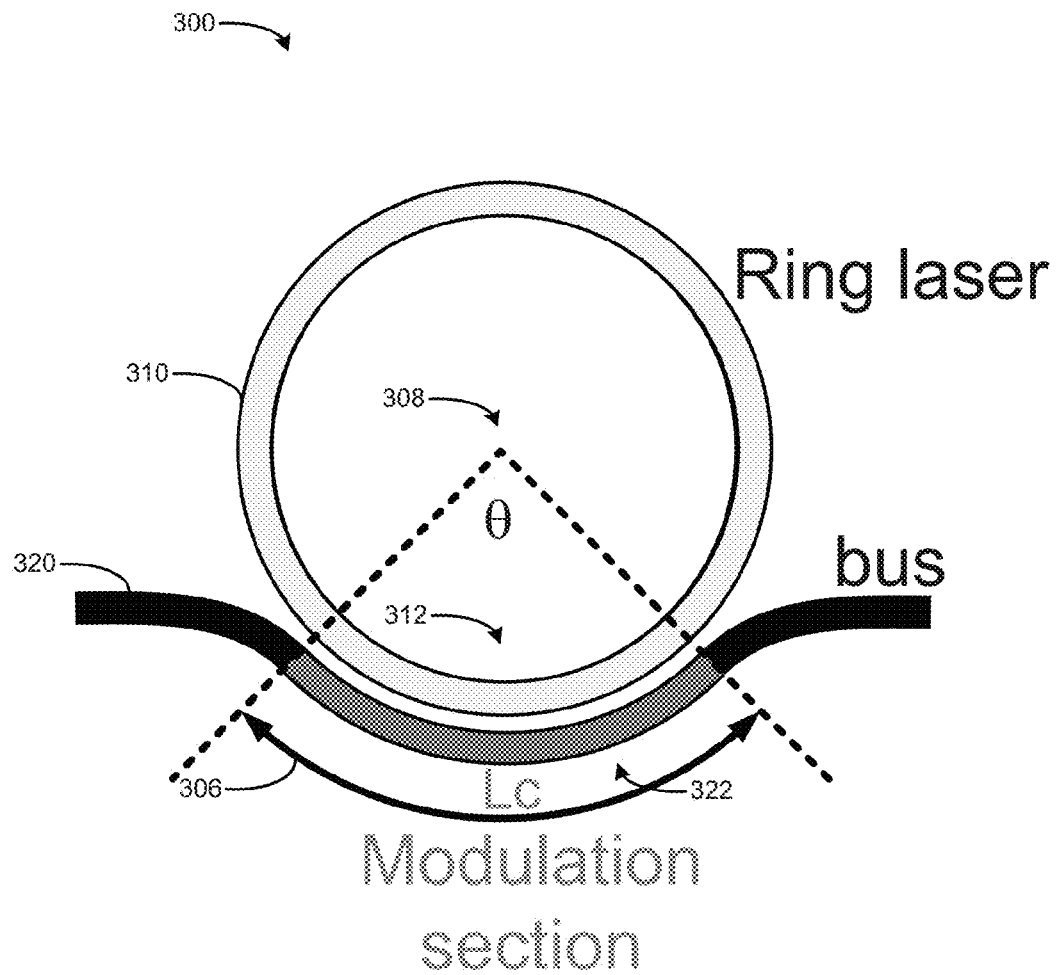
FIG. 3 is a top view diagram of a device including a ring waveguide and bus waveguide according to an example.

FIG. 3 is a top view diagram of a device 300 including a ring waveguide 310 and bus waveguide 320 according to an example. The ring waveguide 310 includes a first coupled portion 312. The bus waveguide 320 is conformal, and includes a second coupled portion 322 coupled to the first coupled portion 312 of the ring waveguide 310. The second coupled portion 322 is curved, corresponding to the circular shape of the ring waveguide 310, according to a fan-out coupling angle 308 and coupling length (Lc) 306. The device 300 is to provide lasing output based on resonance of the ring waveguide 310. In the example of FIG. 3, the lasing output is variable based on varying a modal index of the second coupled portion 322 of the bus waveguide 320. However, in alternate examples, lasing output may be varied based on varying a modal index of the first coupled portion 312 of the ring waveguide 310 (in addition to, or as an alternative to, modulation of the second coupled portion 322).

Device 300 includes a ring waveguide 310 and a bent bus waveguide 320. The ring waveguide 310 is to provide lasing resonance, to serve as a laser. The bus waveguide 320 is bent to form a conformal bus waveguide that follows a contour of the ring waveguide 310 to extend the coupling length 306 (Lc) shared by the ring waveguide 310 and the bus waveguide 320. The conformal bus waveguide enhances control of output coupling. The coupling length 306 enables a bent directional coupler for more controllable coupling, such that a coupling gap between the ring waveguide 310 and the bus waveguide 320 can be large enough for consistent fabrication, without a need to fabricate the waveguides with an extremely small coupling gap between them. The modal index of the bent section the bus waveguide 320 (i.e., second coupled portion 322) is modulated/tuned to enable a phase and outcoupling change of the ring laser device 300. Alternatively, the modal index of the corresponding first coupled portion 312 of the ring waveguide 310 also may be modulated. Thus, either of the bent waveguides (ring waveguide 310 and/or bus waveguide 320) in the bent directional coupler device 300 may be selectively modulated at a coupled portion to realize resonance shift (i.e., phase shift), coupling modulation, and corresponding shift of lasing output.

In alternate examples, the ring waveguide 310 may be other resonant topographies, including a racetrack waveguide. Similarly, the bus waveguide 320 may be other topographies such as straight or curved (e.g., to form a curved directional coupler with the ring waveguide 310). The ring waveguide 310 and the bus waveguide 320 may be formed of the same material, having equal values for default modal indices. By changing the modal index of at least one of the waveguides, the laser outcoupling is also changed, (e.g., because the two waveguides no longer have equal modal indices). In an example, the change between modal indices results in a corresponding change in laser outcoupling that follows a sinusoidal behavior (e.g., the laser outcoupling increases initially as Lc increases, reaches a maximum, and eventually decreases back to a default value as Lc continuously increases). The sinusoidal behavior of the response to changes in modal indices by the laser outcoupling means that the laser outcoupling can experience a relatively large change initially along the sinusoidal response, for a relatively small change initially in the difference between the modal indices of the waveguides. Thus, by changing the modal index of one or both of the waveguides, it is possible to tune the lasing output coupling quickly and efficiently.

The coupling may be varied by selectively changing a portion of one or both of the two waveguides 310, 320. However, a device 300 may implement a design choice to provide variability to a portion of the bus waveguide 320 for ease of fabrication (e.g., based on providing a modulating component such as a heater toward an outside of the bus waveguide 320, without needing to provide a modulating component within the ring waveguide 310). In alternate examples, a modulating component may be provided at the ring waveguide 310, or at both the bus waveguide 320 and ring waveguide 310.

Figure 4:
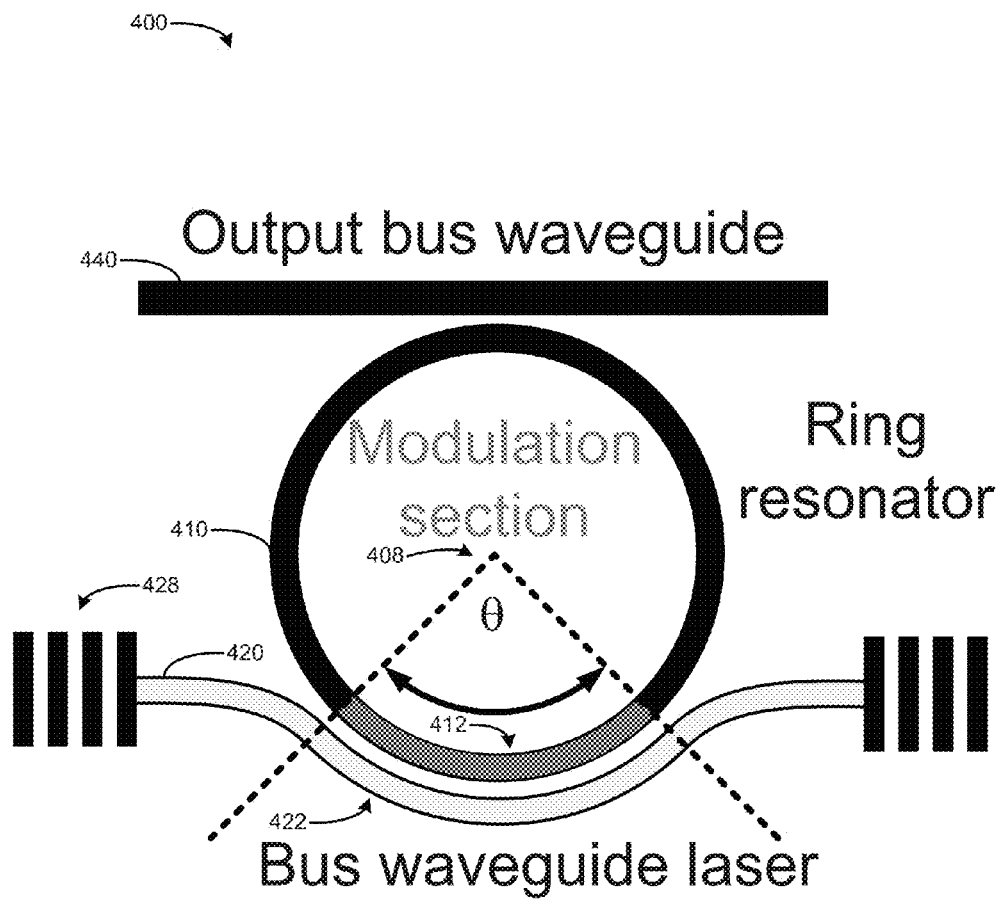
FIG. 4 is a top view diagram of a device including a ring waveguide, bus waveguide, and output waveguide according to an example.

FIG. 4 is a top view diagram of a device 400 including a ring waveguide 410, bus waveguide 420, and output waveguide 440 according to an example. The ring waveguide 410 is a passive ring resonator, and includes a first coupled portion 412. The bus waveguide 420 is conformal, and includes a second coupled portion 422 coupled to the first coupled portion 412 of the ring waveguide 410. The second coupled portion 422 is curved, corresponding to the circular shape of the ring waveguide 410, according to a coupling angle 408. The bus waveguide 420 includes distributed Bragg reflectors 428 to establish a resonance cavity. The output waveguide 440 is coupled to the ring waveguide 410 to provide lasing output based on resonance of the bus waveguide 420 and the ring waveguide 410. The lasing output is variable based on varying a modal index of the first coupled portion 412 of the ring waveguide 410 (and in alternate examples, other portions of the ring waveguide 410 and output waveguide 440 may be varied).

In the example of FIG. 4, in contrast to FIG. 3, the bus waveguide 420 (and not the ring waveguide 410) serves as a laser resonator to provide the medium of optical gain. Lasing is based on a Fabry-Pérot Resonator including distributed Bragg reflectors 428 (DBR) coupled to ends of the conformal bus waveguide 420. The ring waveguide 410 is a passive ring resonator, coupled to the bent/conformal first coupled portion 412 of the bus waveguide 420 laser to outcouple lasing from the bus waveguide 420. The ring waveguide 410 is also coupled to the output waveguide 440, to extract optical power output from the ring waveguide 410, By modulating the first coupled portion 412 of the ring waveguide 410 (and/or the second coupled portion 422 of the conformal bus waveguide 420), the amount of lasing output power varies, along with a phase of the ring waveguide 410. In alternate examples, the conformal/bent shape of the bus waveguide 420 may be replaced with a straight waveguide, instead of bent.

Figure 5A:
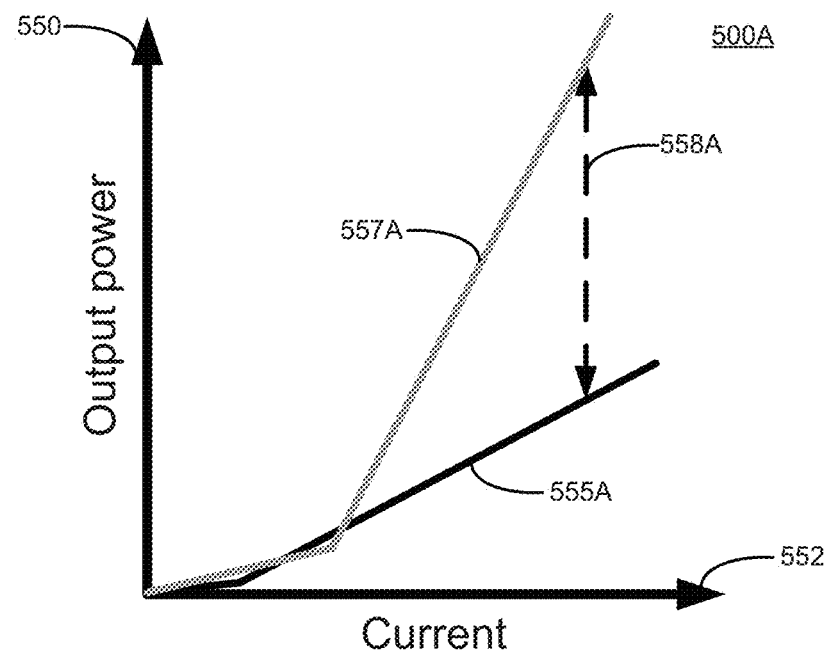
FIG. 5A is a chart of output power as a function of current according to an example.

FIG. 5A is a chart 500A of output power 550 as a function of current 552 according to an example. Chart 500A includes a first curve 555A and a second curve 557A. Hold point 558A is indicated on chart 500A. Chart 500A represents device performance (a light-current characteristic) when laser outcoupling is varied, e.g., between a first value corresponding to the first curve 555A and a second value corresponding to the second curve 557A. When lasing outcoupling is changed, laser modulation can be achieved even while keeping the laser injection current 552 constant (i.e., at hold point 558A) while still varying the output power, by allowing more or less power output lasing coupling out to the bus waveguide.

More specifically, the first curve 555A represents a relatively low coupling and associated weak lasing output power 550. Accordingly, most of the resonant lasing power remains confined inside the laser resonator (e.g., a ring laser, waveguide laser, or other resonator). The first curve 555A is associated with a small lasing threshold for output power 550 (as indicated in the "elbow" where a slope of the first curve 555A changes), and the output power 550 of the first curve 555A rises gently and remains relatively small across of range of currents 552. A device/system may change its behavior based on selectively modulating at least one modal index of the ring and/or bus waveguides. Thus, an appropriate change in the difference between modal indices can cause behavior to switch from following the first curve 555A to the second curve 557A. Behavior according to the second curve 557A is associated with a larger current 552 to reach the threshold (the elbow in the slope), as well as a greater output power 550 along the second curve 557A. The hold point 558A indicates a suitable divergence between the first curve 555A and second curve 557A, that may be usable to identify a signal corresponding to a digital 0 (first curve 555A) and a digital 1 (second curve 557A). Accordingly, a device/system may control a difference in modal indices to adjust lasing output and modulate the lasing output power 550 for digital communication according to the first curve 555A and second curve 557A. Even though the driving current 552 may be held at the hold point, the example systems/devices provided herein enable output power 550 to be varied according to the varying coupling, without a need to change the current 552. The hold point 558A is indicated at a relatively wide divergence between the first curve 555A and the second curve 557A. In alternate examples, the hold point 558A may be moved to the left or right.

Varying coupling, based on selectively changing a difference between modal indices of ring and bus waveguides, may be achieved using a ring laser (e.g., modulating the coupling portion of the ring laser and/or bus waveguide) or a bus waveguide laser (e.g., modulating the coupling portion of the bus waveguide laser and/or passive waveguide ring).

Figure 5B:
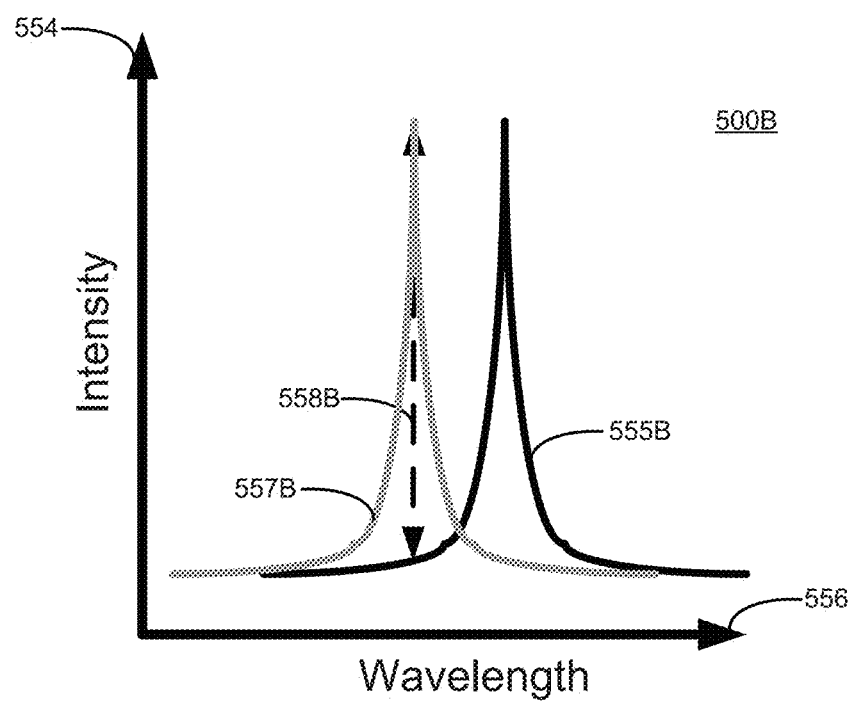
FIG. 5B is a chart of intensity as a function wavelength according to an example.

FIG. 5B is a chart 500B of intensity 554 as a function wavelength 556 according to an example. Chart 500B includes a hold point 558B, and illustrates device/system performance (spectrum characteristic) when a phase of the device/system is changed. When the index of the bus waveguide and/or the corresponding ring waveguide section is changed (i.e., changing a difference between mode indices), a phase of the laser will also change. A phase change causes a shift in the resonance frequency (i.e., wavelength 556). The phase change shift enables the device behavior to switch between following first curve 555B and second curve 557B, without a need to change wavelength. More specifically, the bus waveguide and ring waveguide have their own resonance wavelengths, and a phase change in one or both of the waveguides can lead to resonance mismatch and behavior according to different curves (i.e., first curve 555B and second curve 557B). The modulated laser may be held at a particular wavelength 556 (e.g., at hold point 558B), which enables a large power variation between a peak of the second curve 557B and a base of the first curve 555B corresponding to the wavelength 556 of the hold point 558B. Thus, FIG. 5B illustrates how wavelength 556 may shift based on a change in a waveguide index (e.g., based on a selective change in the difference between modal indices), resulting in a phase change of the laser cavity.

Figure 6A:
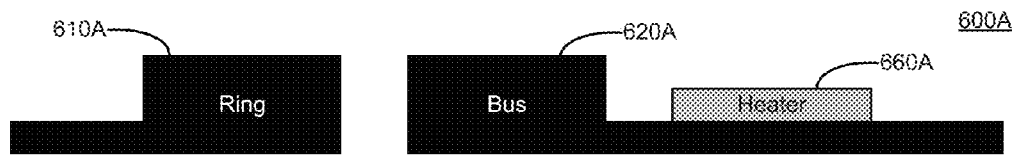
FIG. 6A is a side section view diagram of a device including a ring waveguide, bus waveguide, and heater according to an example.
Figure 6B:
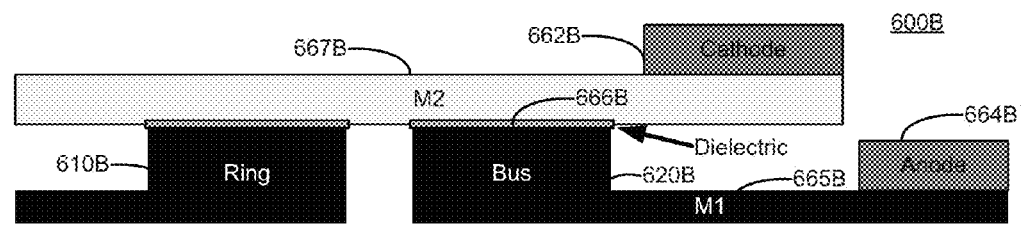
FIG. 6B is a side section view diagram of a device including a ring waveguide, bus waveguide, and dielectric according to an example.
Figure 6C:
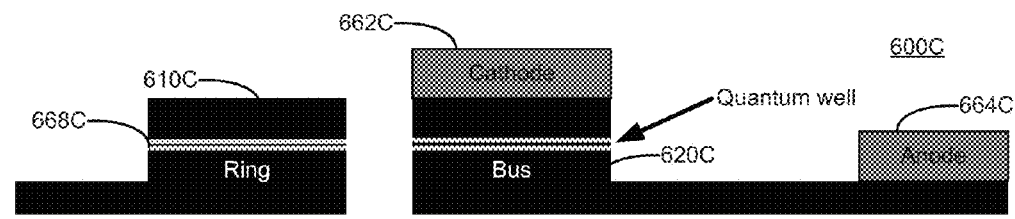
FIG. 6C is a side section view diagram of a device including a ring waveguide, bus waveguide, and quantum well to an example.
Figure 6D:
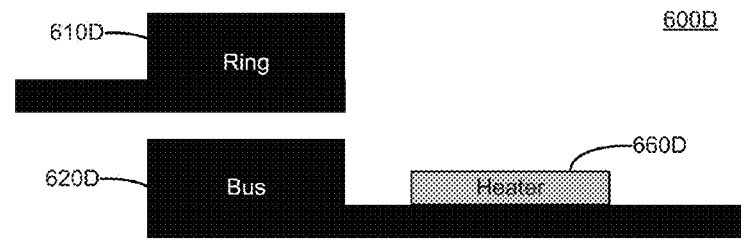
FIG. 6D is a side section view diagram of a vertically coupled device including a ring waveguide, bus waveguide, and heater according to an example.

FIGS. 6A-6E illustrate cross-section schematic views of ring and bent bus waveguide whose modal index is changed based on various techniques. The techniques may include electrical, electro-optical, thermo-optical, mechanical, acoustic, magnetic, and other tuning approaches to change a waveguide modal index. Changes to the modal index may be realized based on changing an index of the waveguide core and/or the index of the waveguide cladding. FIGS. 6A-6C and 6E illustrate examples of co-planar evanescent coupling, and FIG. 6D illustrates an example of vertical evanescent coupling.

FIG. 6A is a side section view diagram of a device 600A including a ring waveguide 610A, bus waveguide 620A, and heater 660A according to an example. The ring waveguide 610A is coplanar with, and coupled to, the bus waveguide 620A. The heater 660A is disposed on a substrate associated with bus waveguide 620A.

The heater 660A may be placed on a substrate and/or a slab region of the bus waveguide 620A. Heat dissipates from the heater 660A to the bus waveguide 620A to thermally change a section of the bus waveguide modal index, without changing other sections. In an alternate example, the heater 660A may be placed proximate to the ring waveguide 610A, including placing heaters 660A at both the bus waveguide 620A and the ring waveguide 610A.

FIG. 6B is a side section view diagram of a device 600B including a ring waveguide 610B, bus waveguide 620B, and dielectric 666B according to an example. The dielectric 666B is disposed between a second material 667B and the ring waveguide 610B and bus waveguide 620B. Anode 664B is disposed on first material 665B associated with the bus waveguide 620B. Cathode 662B is disposed on the second material 667B.

The arrangement in FIG. 6B provides a way to vary carrier concentration based on forming a capacitor (e.g., a Metal-Oxide-Semiconductor (MOS) capacitor). The dielectric layer 666B is sandwiched by two semiconductor layers. M1 665B and M2 667B, which may be formed by the same material or by different materials. In this capacitor structure, electrical carriers can accumulate or deplete from the dielectric layer 666B when a voltage is applied between cathode 662B and anode 664B. The change of carrier concentration also causes a change in material index, and subsequently, modal index, and absorption loss, in the bus waveguide 620B. As a result, a difference between the modal indices of particular sections of the bus waveguide 620B and ring waveguide 610B may be controlled, to vary a lasing output of the corresponding device 600B, without varying other sections of the waveguides. In alternate examples, the capacitor structure also may be arranged to vary the modal index and absorption loss in the ring waveguide 610B.

FIG. 6C is a side section view diagram of a device 600C including a ring waveguide 610C, bus waveguide 620C, and quantum well 668C according to an example. The quantum well 668C layer may be disposed in the ring waveguide 610C and/or the bus waveguide 620C. Anode 664C is disposed proximate to the bus waveguide 6200 (e.g., on a substrate material). Cathode 662C is disposed on the bus waveguide 620C.

A lasing output of device 600C may be varied based on quantum-well-based electro-optical effects. Quantum well (s) 668C are embedded in the structure (ring waveguide 6100 and/or bus waveguide 620C), enabling other electro-optic effects (e.g., plasma dispersion effect, Kerr effect, Quantum-confined Stark effect, Franz-Keldysh effect, Pockels effect, etc.) to occur. In an example, the ring waveguide 668C and bus waveguide 620C may be formed of compound semiconductor materials such as III-V materials.

FIG. 6D is a side section view diagram of a vertically coupled device 600D including a ring waveguide 610D, bus waveguide 620D, and heater 660D according to an example. The ring waveguide 610D is above, and vertically coupled to, the bus waveguide 620D.

The evanescent coupling between the ring waveguide 610D and the bus waveguide 620D occurs in a vertical plane, e.g., perpendicular to a diameter of the ring waveguide 610D. Accordingly, the heater 660D may be placed proximate to one waveguide, at a different height than the other waveguide. The bus waveguide 620D is illustrated as being positioned below the ring waveguide 610D. In alternate examples of vertical coupling, the bus waveguide may be positioned above the ring waveguide 610D (including vertical placements that are offset horizontally, compared to fully vertical arrangements).

Figure 6E:
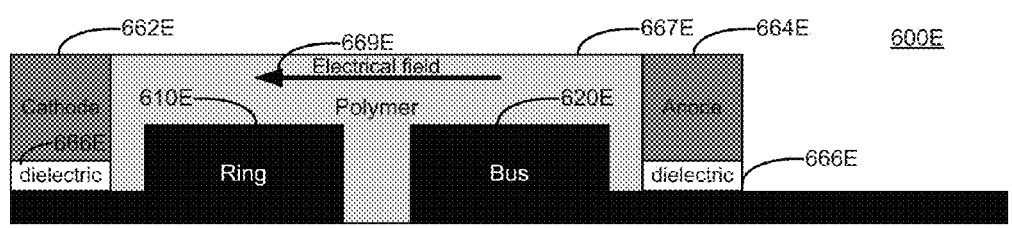
FIG. 6E is a side section view diagram of a device including a ring waveguide, bus waveguide, and electrical field according to an example.

FIG. 6E is a side section view diagram of a device 600E including a ring waveguide 610E, bus waveguide 620E, and electrical field 669E according to an example. A polymer 667E is disposed on the ring waveguide 610E and bus waveguide 620E as waveguide cladding. Anode 664E is disposed proximate to the bus waveguide 620E on dielectric 666E. Cathode 662E is disposed proximate to the ring waveguide 610E on dielectric 666E. Electrical field 669E extends between the anode 664E and cathode 662E. Thus, the electrical field 669E may be developed across the cladding of both the ring waveguide 610E and the bus waveguide 620E, according to voltages applied across the cathode 662E and anode 664E. Accordingly, the variation of the electrical field may change the material index of the polymer 667E, and subsequently change the modal indices of the ring waveguide and bus waveguide to realize outcoupling change.

Figure 7:
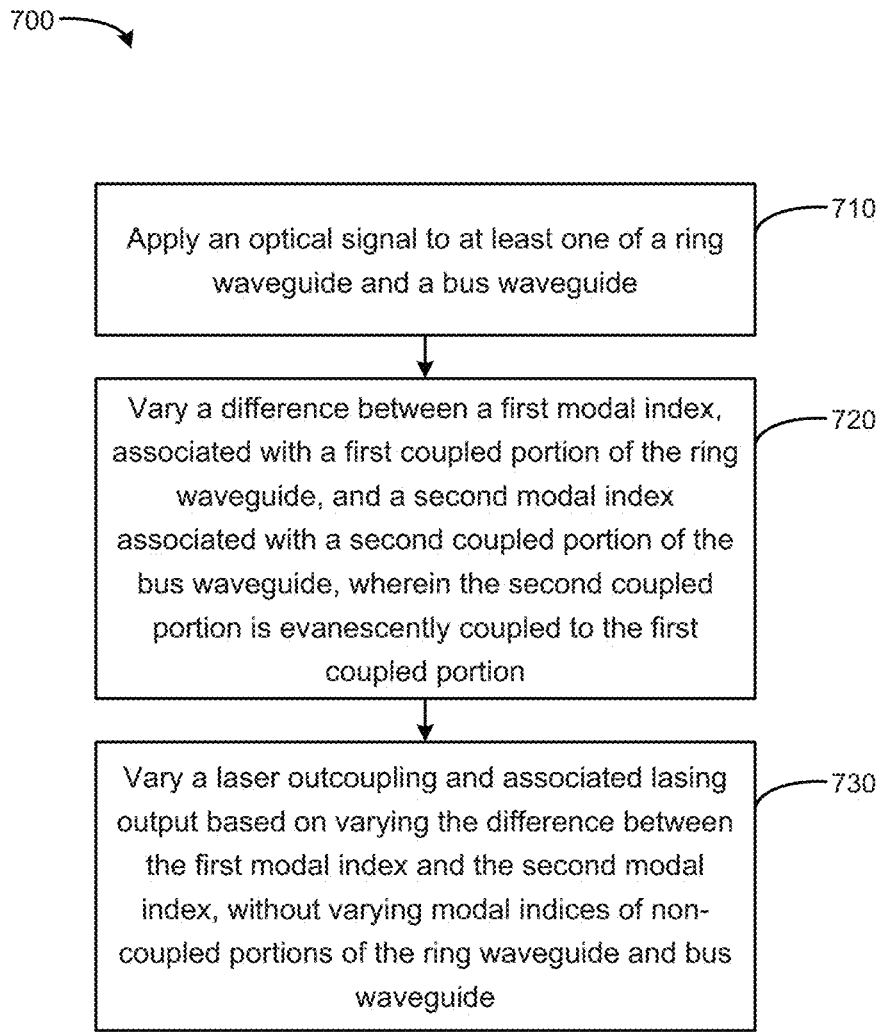
FIG. 7 is a flow chart based on varying lasing output according to an example.

Referring to FIG. 7, a flow diagram is illustrated in accordance with various examples of the present disclosure. The flow diagram represents processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 7 is a flow chart 700 based on varying lasing output according to an example. In block 710, an optical signal is applied to at least one of a ring waveguide and a bus waveguide. For example, a ring waveguide may serve as a lasing resonator to develop optical energy that is to be selectively outcoupled as lasing output. In block 720, a difference is varied between a first modal index, associated with a first coupled portion of the ring waveguide, and a second modal index associated with a second coupled portion of the bus waveguide, wherein the second coupled portion is evanescently coupled to the first coupled portion. For example, heating may be applied selectively to a first conformal portion of the bus waveguide, without applying heating to the ring waveguide or non-coupled portions of the bus waveguide. In block 730, a laser outcoupling and associated lasing output are varied based on varying the difference between the first modal index and the second modal index, without varying modal indices of non-coupled portions of the ring waveguide and bus waveguide. For example, the difference between the first and second modal indices may be achieved based on selectively heating a coupled portion of the conformal waveguide, to change the modal index of that portion of the waveguide, without changing the modal index of the ring waveguide or non-coupled portions of the bus waveguide. In alternate examples, a modal index of the coupled portion of the ring waveguide may be varied.

What is claimed is:

1. A device comprising:
    a ring waveguide having a first coupled portion associated with a first modal index;
    a bus waveguide having a second coupled portion, associated with a second modal index wherein the second coupled portion is evanescently coupleable to the first coupled portion; and
    a capacitor structure to apply electrical carriers to vary a difference between the first modal index and the second modal index, without varying modal indices of non-coupled portions of the ring waveguide and the bus waveguide;
    wherein a laser outcoupling and associated lasing output of the device is variable based on an evanescent coupling between the first coupled portion and the second coupled portion, without varying modal indices of non-coupled portions of the ring waveguide and bus waveguide.

2. The device of claim 1, wherein the ring waveguide is to serve as a laser cavity based on resonance of the ring waveguide.

3. The device of claim 1, further comprising an output waveguide coupled to the ring waveguide based on a third coupled portion of the ring waveguide; wherein the bus waveguide is to serve as a laser cavity based on resonance of the bus waveguide; wherein the ring waveguide is passive and is to couple lasing output from the bus waveguide to the output waveguide.

4. The device of claim 1, wherein the bus waveguide is a conformal waveguide that is curved corresponding to the coupling with the ring waveguide.

5. The device of claim 1, wherein the difference between the first modal index and the second modal index is achieved based on changing an index of a cladding of at least one of: the first coupled portion of the ring waveguide, and the second coupled portion of the bus waveguide.

6. The device of claim 1, wherein the ring waveguide is coplanar with the bus waveguide.

7. The device of claim 1, wherein the ring waveguide is non-coplanar with, and vertically displaced relative to, the bus waveguide.

8. The device of claim 1, wherein the capacitor structure comprises a dielectric layer sandwiched by semiconductor layers of the device.

9. A system comprising:
    a ring waveguide having a first coupled portion associated with a first modal index;
    a bus waveguide having a second coupled portion, associated with a second modal index, wherein the second coupled portion is evanescently coupled to the first coupled portion; and
    a quantum well structure, disposed in at least one of the ring waveguide or the bus waveguide, to vary a difference between the first modal index and the second modal index based on an electro-optic effect,
    wherein a laser outcoupling and associated lasing output of the system varies based on varying the difference between the first modal index and the second modal index to vary coupling between the first coupled portion and the second coupled portion, without varying modal indices of non-coupled portions of the ring waveguide and bus waveguide.

10. The system of claim 9, wherein the quantum well structure is disposed in the bus waveguide to vary the second modal index of the second coupled portion of the bus waveguide without varying the first modal index of the ring waveguide, to vary the difference between the first modal index and the second modal index.

11. The system of claim 9, wherein the quantum well structure is disposed in the ring waveguide to vary the first modal index of the ring waveguide without varying the second modal index of the bus waveguide, to vary the difference between the first modal index and the second modal index.

12. A method, comprising:
    applying an optical signal to at least one of a ring waveguide and a bus waveguide;
    varying a difference between a first modal index associated with a first coupled portion of the ring waveguide, and a second modal index associated with a second coupled portion of the bus waveguide using a modulation actuator based on at least one of electrical tuning, mechanical tuning, acoustic tuning, and magnetic tuning, wherein the second coupled portion is evanescently coupled to the first coupled portion; and
    varying a laser outcoupling and associated lasing output based on varying the difference between the first modal index and the second modal index, without varying modal indices of non-coupled portions of the ring waveguide and bus waveguide.

13. The method of claim 12, wherein the associated lasing output is based on the optical signal.

14. The method of claim 12, wherein the varying the difference further comprises varying the first modal index of the ring waveguide without varying the second modal index of the bus waveguide.

15. The method of claim 12, wherein the varying the difference further comprises varying the second modal index of the second coupled portion of the bus waveguide without varying the first modal index of the ring waveguide.

16. The method of claim 12, wherein the difference between the first modal index and the second modal index is achieved based on changing an index of a cladding of at least one of:
    the first coupled portion of the ring waveguide, and the second coupled portion of the bus waveguide.

17. The system of claim 9, wherein the electro-optic effect is at least one of a plasma dispersion effect, a Kerr effect, a Quantum-confined Stark effect, a Franz-Keldysh effect, or a Pockels effect.

* * * * *